: US 7,049,647 B2
(45) Date of Patent: May 23, 2006

(54) SEMICONDUCTOR MEMORY CELL WITH TRENCH CAPACITOR AND SELECTION TRANSISTOR AND METHOD FOR FABRICATING IT

(75) Inventors: Wolfram Karcher, Langebrueck (DE); Dietmar Temmler, Dresden (DE); Martin Schrems, Eggersdorf (AT)

(73) Assignee: Infineon Technologies AG, Munich (DE)

( * ) Notice: Subject to any disclaimer, the term of this patent is extended or adjusted under 35 U.S.C. 154(b) by 5 days.

(21) Appl. No.: 10/390,871

(22) Filed: Mar. 17, 2003

(65) Prior Publication Data

US 2003/0168690 A1 Sep. 11, 2003

Related U.S. Application Data

(63) Continuation of application No. PCT/DE01/03235, filed on Aug. 4, 2001.

(30) Foreign Application Priority Data

Sep. 15, 2000 (DE) ................................ 100 45 694

(51) Int. Cl.
*H01L 21/8242* (2006.01)

(52) U.S. Cl. ...................... 257/301; 257/300; 257/302; 257/303; 257/304; 438/242; 438/243; 438/244; 438/253

(58) Field of Classification Search ........ 257/301–304, 257/296, 306, 300; 438/239, 242–244, 241, 438/386–387, 253
See application file for complete search history.

(56) References Cited

U.S. PATENT DOCUMENTS

| 4,649,625 | A |  | 3/1987 | Lu |
| 5,262,002 | A |  | 11/1993 | Grewal et al. |
| 5,336,629 | A |  | 8/1994 | Dhong et al. |
| 5,360,758 | A |  | 11/1994 | Bronner et al. |
| 5,744,386 | A |  | 4/1998 | Kenney |
| 5,867,420 | A |  | 2/1999 | Alsmeier |
| 5,998,821 | A |  | 12/1999 | Hieda et al. |
| 6,008,104 | A |  | 12/1999 | Schrems |
| 6,207,494 | B1 | * | 3/2001 | Graimann et al. ........... 438/248 |
| 6,297,086 | B1 | * | 10/2001 | Hegde et al. ............... 438/243 |
| 6,352,892 | B1 | * | 3/2002 | Jammy et al. .............. 438/244 |
| 6,452,224 | B1 | * | 9/2002 | Mandelman et al. ........ 257/296 |
| 6,509,599 | B1 | * | 1/2003 | Wurster et al. ............. 257/301 |
| 6,551,398 | B1 | * | 4/2003 | Abe et al. ........................ 117/3 |

(Continued)

FOREIGN PATENT DOCUMENTS

DE 199 11 149 C1 5/2000

(Continued)

OTHER PUBLICATIONS

Silicon Processing for The Visi eRA, vol. 1, pp. 124, s. Wolf et al.*

(Continued)

*Primary Examiner*—Donghee Kang
(74) *Attorney, Agent, or Firm*—Laurence A. Greenberg; Werner H. Stemer; Ralph E. Locher

(57) ABSTRACT

A semiconductor memory cell is formed in a substrate and includes a trench capacitor and a selection transistor. The trench capacitor includes a capacitor dielectric and a conductive trench filling. Disposed on the conductive trench filling is a diffusion barrier on which an epitaxial layer is formed. The selection transistor is disposed as a planar transistor above the trench capacitor. A drain doping region of the selection transistor is disposed in the epitaxial layer.

13 Claims, 9 Drawing Sheets

U.S. PATENT DOCUMENTS 6,565,649 B1 * 5/2003 Mule'Stagno et al. ........ 117/13

FOREIGN PATENT DOCUMENTS

| DE | 199 41 148 A1 | 4/2001 |
|----|---------------|--------|
| DE | 199 46 719 A1 | 4/2001 |
| EP | 0 463 459 A1 | 1/1992 |
| EP | 0 621 632 A1 | 10/1994 |
| EP | 0 971 414 A1 | 1/2000 |
| EP | 1 011 138 A2 | 6/2000 |

OTHER PUBLICATIONS

D. Widmann et al.: Technologie hochintegrierter Schaltungen [technology of high integrated circuits], *Springer Verlag, Berlin*, $2^{nd}$ ed., 1996, pp. 44-48.

Stanley Wolf et al.: Silicon Processing for the VLSI Era vol. 1: Process Technology, *Lattice Press, Sunset Beach, California*, 1986, pp. 124-160.

* cited by examiner

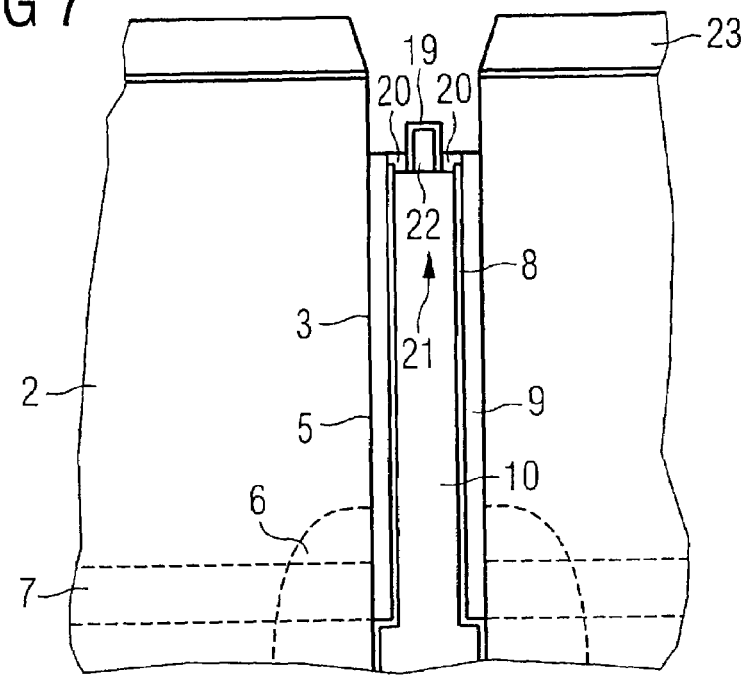
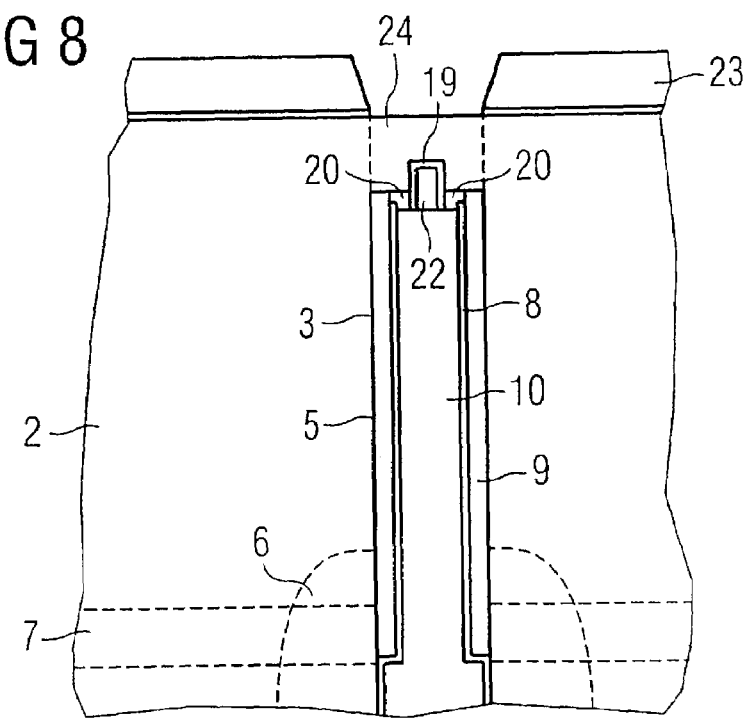

SEMICONDUCTOR MEMORY CELL WITH TRENCH CAPACITOR AND SELECTION TRANSISTOR AND METHOD FOR FABRICATING IT

CROSS-REFERENCE TO RELATED APPLICATION

This application is a continuation of copending International Application No. PCT/DE01/03235, filed Aug. 24, 2001, which designated the United States and was not published in English.

BACKGROUND OF THE INVENTION

Field of the Invention

The present invention relates to a semiconductor memory cell having a trench capacitor and a selection transistor, and to a method for fabricating it.

Integrated circuits (ICs) or chips use capacitors for the purpose of storing charge, such as e.g. a dynamic random access memory (DRAM). The charge state in the capacitor represents a data bit in this case.

A DRAM chip contains a matrix of memory cells which are configured in the form of rows and columns and are driven by word lines and bit lines. The reading of data from the memory cells or the writing of data to the memory cells is realized by activating suitable word lines and bit lines.

A DRAM memory cell usually contains a transistor connected to a capacitor. The transistor contains two diffusion regions which are separated from one another by a channel controlled by a gate. Depending on the direction of the current flow, one diffusion region is referred to as the drain and the other as the source. The drain region is connected to the bit line, the source region is connected to the trench capacitor and the gate is connected to the word line. By applying suitable voltages to the gate, the transistor is controlled in such a way that a current flow between the drain region and the source region through the channel is switched on and off.

The charge stored in the capacitor decreases over time on account of leakage current. Before the charge has decreased to an indeterminate level below a threshold value, the capacitor must be refreshed. For this reason, these memory cells are referred to as dynamic RAM (DRAM). A typical configuration of a semiconductor memory having a trench capacitor and a selection transistor is specified in U.S. Pat. No. 5,867,420 to Alsmeier, which is commonly-assigned.

One problem in known DRAM variants is the production of a sufficiently large capacitance for the trench capacitor. This problem will be aggravated in future by the advancing miniaturization of semiconductor components. The continuous increase in the integration density means that the area available per memory cell and thus the capacitance of the trench capacitor decrease ever further. An excessively low capacitance of the trench capacitor can adversely affect the functionality and useability of the memory device since an excessively small quantity of charge is stored in the trench capacitor.

By way of example, sense amplifiers require a sufficient signal level for reliably reading out the information situated in the memory cell. The ratio of the storage capacitance of the trench capacitor to the bit line capacitance is crucial in determining the signal level. If the storage capacitance of the trench capacitor is too low, the ratio may be too small for generating an adequate signal in the sense amplifier.

A low storage capacitance likewise requires a higher refresh frequency, because the quantity of charge stored in the trench capacitor is limited by its capacitance and additionally decreases due to leakage currents. If the quantity of charge falls below a minimum quantity of charge in the storage capacitor, then it is no longer possible for the information stored therein to be read out by the connected sense amplifiers, the information is lost and read errors arise.

One way of avoiding read errors is to reduce the leakage currents. Leakage currents can be reduced on the one hand by transistors and on the other hand by dielectrics, such as e.g. the capacitor dielectric. An undesirably reduced retention time can be lengthened by these measures.

A trench capacitor is usually used in DRAMS. A trench capacitor has a three-dimensional structure that is formed in a silicon substrate. An increase in the trench capacitor electrode area and thus in the capacitance of the trench capacitor can be achieved by etching more deeply into the substrate. In this case, the increase in the capacitance of the trench capacitor does not cause the substrate surface occupied by the memory cell to be enlarged. However, this method is limited because the attainable etching depth of the trench capacitor depends on the trench diameter, and, during fabrication, it is only possible to attain specific finite aspect ratios (ratio between trench depth and trench diameter).

As the increase in the integration density advances, the substrate surface available per memory cell decreases ever further. The associated reduction in the trench diameter inevitably leads to a reduction in the capacitance of the trench capacitor. If the capacitance of the trench capacitor is dimensioned to be so low that the charge that can be stored is insufficient for entirely satisfactory read-out by the sense amplifiers connected downstream, then this results in read errors.

U.S. Pat. No. 5,360,758 to Bronner et al. discloses that, in memory cells with trench capacitor and selection transistor, it is necessary to comply with a minimum distance between the trench capacitor and the transistor. This is necessary because, during thermal steps, the electrical contact between the trench capacitor and the transistor is produced by the outdiffusion of dopant originally situated in the trench capacitor. In this case, the outdiffusion of the dopant typically extends over distances of between 50 and 150 nanometers (nm). It must be ensured in this case that the dopant does not diffuse into the channel of selection transistor, where it can lead to increased leakage currents through the transistor that render the relevant memory cell unusable. This means that a memory cell that is theoretically possible without outdiffusion has to be enlarged by the size of the outdiffusion.

SUMMARY OF THE INVENTION

It is accordingly an object of the invention to provide a semiconductor memory cell with trench capacitor and selection transistor and method for fabricating it that overcome the hereinafore-mentioned disadvantages of the heretofore-known devices and methods of this general type and that reduce space requirement and improve retention time.

With the foregoing and other objects in view, there is provided, in accordance with the invention, a semiconductor memory cell having the following features:
   a trench, in which a trench capacitor is disposed;
   a selection transistor, which is disposed as a planar transistor above the trench capacitor;
   a capacitor dielectric, which is disposed in the trench;

a conductive trench filling, which is disposed in the trench;

a diffusion barrier, which is disposed on the conductive trench filling;

an epitaxial layer grown epitaxially over the diffusion barrier;

a source doping region of the selection transistor, which is disposed in the epitaxial layer.

By virtue of the configuration according to the invention, firstly a diffusion barrier is disposed on the conductive trench filling. The diffusion barrier has the task of preventing an outdiffusion of dopant situated in the conductive trench filling, which might damage the selection transistor. What is novel in this case is that the diffusion barrier is formed horizontally. In order that the space used by the memory cell is made as small as possible, measures are taken to dispose the selection transistor as far as possible directly above the trench capacitor. To that end, the trench capacitor and the diffusion barrier are overgrown with an epitaxial layer. In this case, the epitaxial layer forms in a monocrystalline fashion, so that a source doping region of the selection transistor can be disposed in it.

A configuration according to the invention provides for the source doping region of the selection transistor to be contact-connected from underneath with the diffusion barrier. Contact-connecting the diffusion region from underneath advantageously enables space to be saved, so that the substrate surface used by the memory cell can be made as small as possible. Furthermore, the direct contact-connection of the source doping region ensures a low-resistance connection between the diffusion barrier and the source doping region.

A further configuration of the invention provides for the diffusion barrier to be configured horizontally. By virtue of the horizontal configuration of the diffusion barrier, it is possible, by way of example, to provide the entire trench cross section with the diffusion barrier, with the result that, firstly, the outdiffusion of dopant from the trench is prevented and, secondly, an area that is as large as possible is contact-connected with the source doping region of the selection transistor, which ensures a low-resistance contact. The diffusion barrier also includes a vertical contact area. Furthermore, the diffusion barrier between the trench and the source doping region is buried in the source doping region, thereby reducing the pn junction area of the source doping region with respect to the channel and hence the leakage current.

A further variant of the invention provides for an insulating covering layer with an inner hole to be disposed on the conductive trench filling. The insulating covering layer first of all insulates the conductive trench filling from the overlying epitaxial layer grown epitaxially. The inner hole in the covering layer ensures, however, that it is possible to produce an electrical contact between the conductive trench filling and the source doping region—disposed in the epitaxial layer—of the selection transistor. A further variant of the invention provides for a conductive contact to be disposed in the inner hole. The conductive contact is formed in such a way that it makes contact with the conductive trench filling and fills the inner hole of the dielectric layer. By way of example, the conductive trench filling is formed of tungsten, tungsten nitride, titanium nitride, arsenic- or phosphorus-doped polysilicon, or amorphous silicon.

A further advantageous configuration of the invention provides for the conductive contact to connect the conductive trench filling to the source doping region of the selection transistor. This configuration produces a conductive contact between the trench capacitor and the selection transistor.

In a further advantageous configuration of the invention, the cross-sectional area of the inner hole in the dielectric layer is smaller than the cross-sectional area of the trench. This configuration ensures that the trench can have a large cross section, and the trench capacitor thus has a large capacitance, even if the selection transistor is made relatively small. As a result, a small source doping region is made possible because the cross-sectional area of the inner hole is made smaller than the cross-sectional area of the trench, which can thus be adapted to the size of the source doping region. The small source doping region additionally has the advantage that the leakage current between channel and source doping region is reduced.

Furthermore, it is provided that the insulating covering layer is formed as a lateral edge web. Forming the insulating covering layer as a lateral edge web includes, for example, fabricating the insulating covering layer by using a spacer technique. To that end, an insulating layer is deposited conformally on the surface and etched back, the insulating covering layer being formed as a lateral edge web in the trench.

A further configuration of the invention provides for the insulating covering layer to have an upper edge, and for the diffusion barrier to be disposed completely below the upper edge. The advantage of this configuration is cost-effective fabrication. It is a further advantage that if crystal dislocations form at the interface, then they cannot leave the contact region by sliding owing to the dielectric annular layer.

A further configuration according to the invention provides for the covering layer to have an upper edge and for the conductive contact to be disposed above the upper edge. The advantage of this configuration is a larger contact area and thus a reduced resistance, particularly when a thin dielectric barrier such as e.g. silicon nitride having a thickness of one nanometer (1 nm) is used.

Furthermore, it is provided that the diffusion barrier is disposed on the conductive contact.

With regard to the method, the object set is achieved by a method for fabricating a semiconductor memory cell having the following steps:

formation of a trench capacitor in a trench, which has an upper region and a lower region and is filled with a conductive trench filling;

formation of a diffusion barrier on the conductive trench filling;

epitaxial overgrowth of the diffusion barrier with an epitaxial layer;

subsequent formation of a selection transistor as a planar transistor above the trench capacitor, a source doping region of the selection transistor being formed in the epitaxial layer.

In one configuration of the method according to the invention, it is provided that after an epitaxial overgrowth of the diffusion barrier, a reflow process is completed at a higher temperature than the epitaxial overgrowth. The advantage of a reflow process is that the epitaxially grown silicon can planarize a surface due to the elevated temperature for example by a flow effect and growth defects are annealed.

A further advantageous configuration of the method according to the invention provides for the reflow process to be carried out with the addition of hydrogen. The advantage of this method step is that an improved planarization and a further reduction of growth defects are achieved.

Other features which are considered as characteristic for the invention are set forth in the appended claims.

Although the invention is illustrated and described herein as embodied in a semiconductor memory cell with trench capacitor and selection transistor and method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 4 to 8 are sectional views showing a fabrication method for forming the memory cell illustrated in FIG. 3;

DESCRIPTION OF THE PREFERRED EMBODIMENTS

Figure 1:
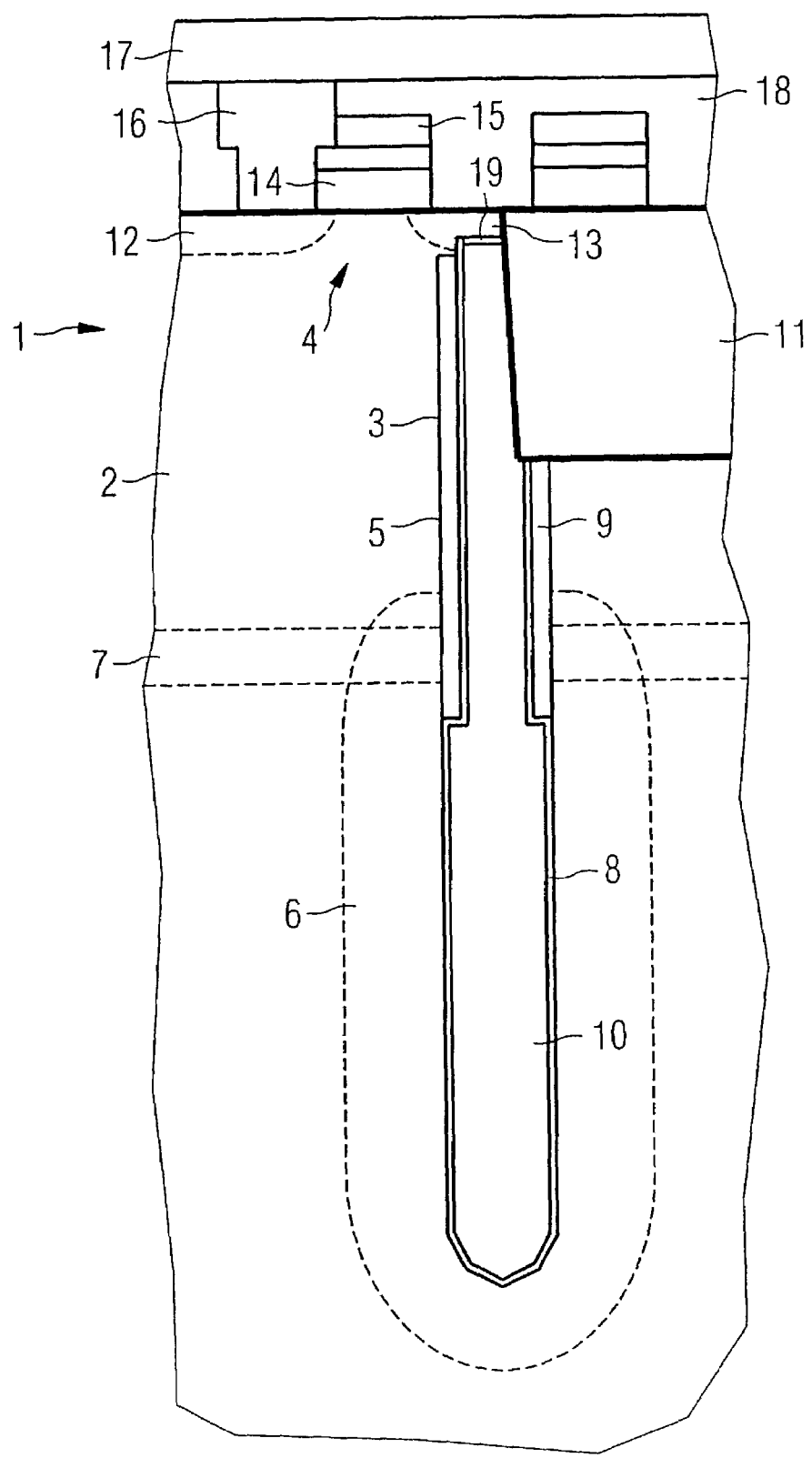
FIG. 1 is a diagrammatic sectional view showing a trench capacitor with a selection transistor according to the invention.

Referring now to the figures of the drawings in detail and first, particularly to FIG. 1 thereof, there is shown a memory cell 1 according to the invention. The memory cell 1 is formed in a substrate 2. The substrate 2 is usually silicon which may be lightly p- or n-doped ($10^{15}$–$10^{17}$ dopant atoms per cubic centimeter). The memory cell 1 includes a trench capacitor 3 and a selection transistor 4. The trench capacitor 3 is formed in a trench 5. The lower region of the trench 5 is surrounded by a buried plate 6. The buried plate 6 is a conductive layer that may be formed for example by the introduction of dopant into the substrate 2. In accordance with the basic doping of the substrate 2, which may have n- or p-type doping, the buried plate is doped significantly more heavily with up to $10^{21}$ dopant atoms/cm$^3$. The buried plate 6 is electrically contact-connected by a buried well 7, which is likewise a doped layer having the same type of dopant as the buried plate 6. An insulation collar 9 is disposed in an upper region of the trench 5. The insulation collar 9 is usually formed from silicon oxide, silicon nitride, or a silicon oxynitride. Furthermore, a dielectric layer 8 is formed in the trench 5. The dielectric layer 8 insulates the buried plate 6 in the lower region of the trench 5 and runs on the insulation collar 9 in the upper region of the trench 5. The dielectric layer 8 is formed from a silicon oxynitride, for example. Optionally, a layer stack including silicon oxide, silicon nitride, and silicon oxynitride may also be involved. The dielectric layer 8 has the task of insulating the buried plate 6 from a conductive trench filling 10 disposed in the trench 5. In this case, the buried plate 6 represents an outer capacitor electrode, the conductive trench filling 10 represents an inner capacitor electrode and the dielectric layer 8 represents the capacitor dielectric.

An isolation trench 11, usually referred to as STI (shallow trench isolation), serves for isolating adjacent memory cells, which are not specifically illustrated in FIG. 1. The selection transistor 4 includes a source region 12, a drain region 13, and a gate 14, on which a word line 15 is disposed. The source region 12 is connected to a bit line 17 by a bit line contact 16. The bit line 17 is insulated from the word line 15 by an intermediate insulation 18. The drain region 13 lies above the trench 5. The drain region 13 is connected to the conductive trench filling 10 by a diffusion barrier 19. The conductive trench filling 10 is usually formed as highly doped and hence low-resistance silicon. In order to prevent the doping of the conductive trench filling 10 from diffusing into the drain region 13 or where possible into the channel of the selection transistor 4, a diffusion barrier 19 is disposed between the conductive trench filling 10 and the drain doping region 13. In this exemplary embodiment, the diffusion barrier 19 is disposed in a planar manner on the conductive trench filling 10. In this case, the diffusion barrier 19 extends from the dielectric layer 8 as far as the isolation trench 11.

Figure 2:
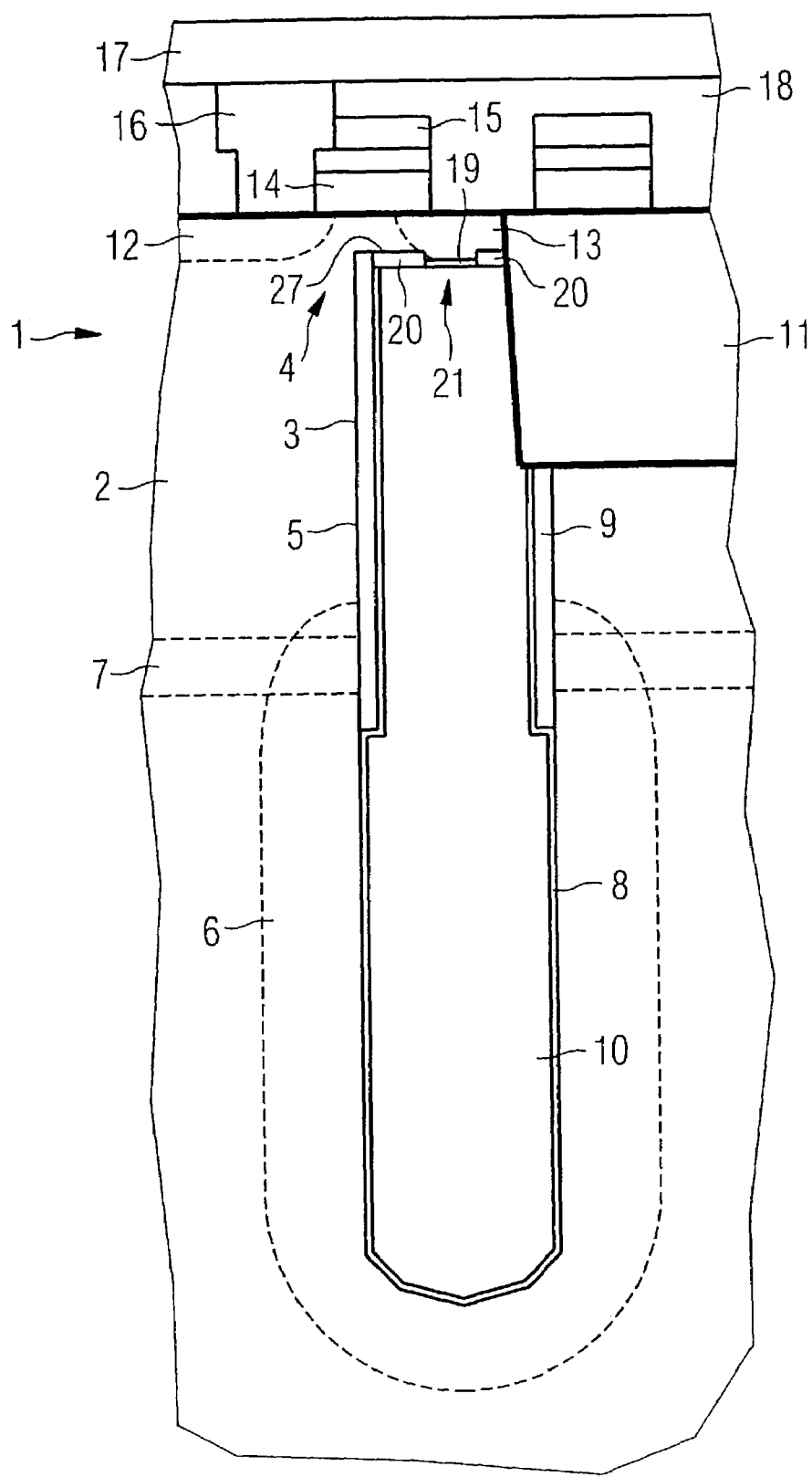
FIG. 2 is a sectional view showing a further embodiment of a trench capacitor with a selection transistor.

FIG. 2 illustrates a further exemplary embodiment of a memory cell 1 according to the invention. The difference from FIG. 1 is that an insulating covering layer 20 with an inner hole 21 is disposed on the conductive trench filling 10. In this exemplary embodiment, the diffusion barrier 19 is disposed in the inner hole 21. By way of example, the insulating covering layer 20 is formed from silicon oxide, silicon nitride, or a silicon oxynitride. The diffusion barrier 19 contact-connects the conductive trench filling 10 with the drain doping region 13. Because a part of the cross-sectional area of the trench 5 is covered by the insulating covering layer 20, and only the region of the inner hole 21 and the diffusion barrier 19 are contact-connected by the drain region 13, the drain region 13 and hence the selection transistor 4 can be made significantly smaller. This has the advantage that a larger proportion of the substrate surface can be utilized by the trench capacitor 3 and, and so the capacitance of the trench capacitor 3 can be increased.

A further exemplary embodiment of a memory cell 1 according to the invention is illustrated with reference to FIG. 3. The difference from FIG. 2 is that a conductive contact 22 is formed in the inner hole 21, which is disposed in the insulating covering layer 20. For its part, the conductive contact 22 is covered with a diffusion barrier 19, so that the outdiffusion of dopant from the conductive trench filling 10 is prevented by the diffusion barrier 19. The conductive contact 22 is formed in such a way that it projects above an upper edge 27 of the insulating covering layer 20 and thus projects into the drain doping region 13. This ensures a low-resistance contact between the conductive trench filling 10 and the drain region 13.

Figure 3:
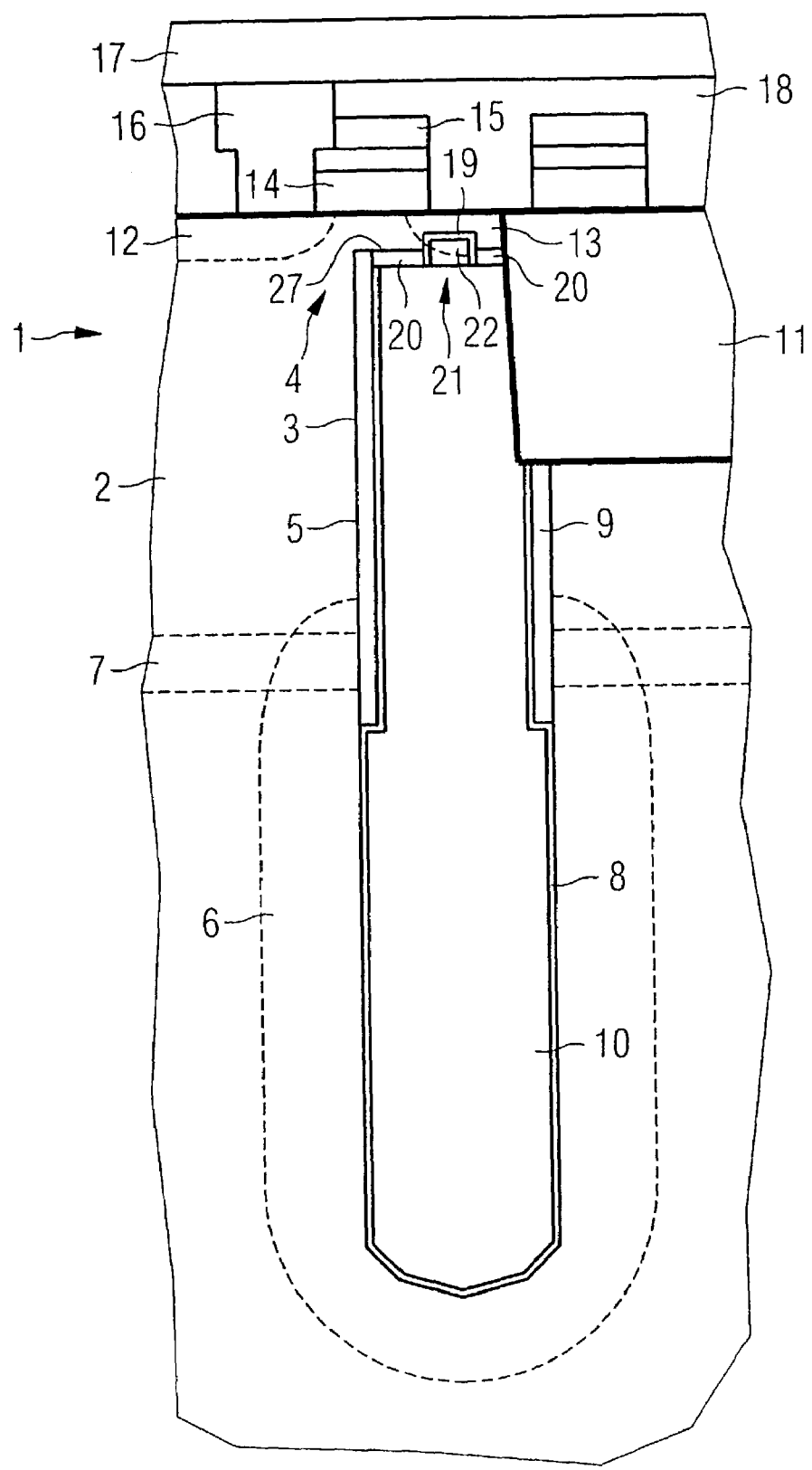
FIG. 3 is a sectional view showing a further embodiment of a trench capacitor with selection transistor, the trench capacitor being connected to the selection transistor by a conductive contact.
Figure 4:
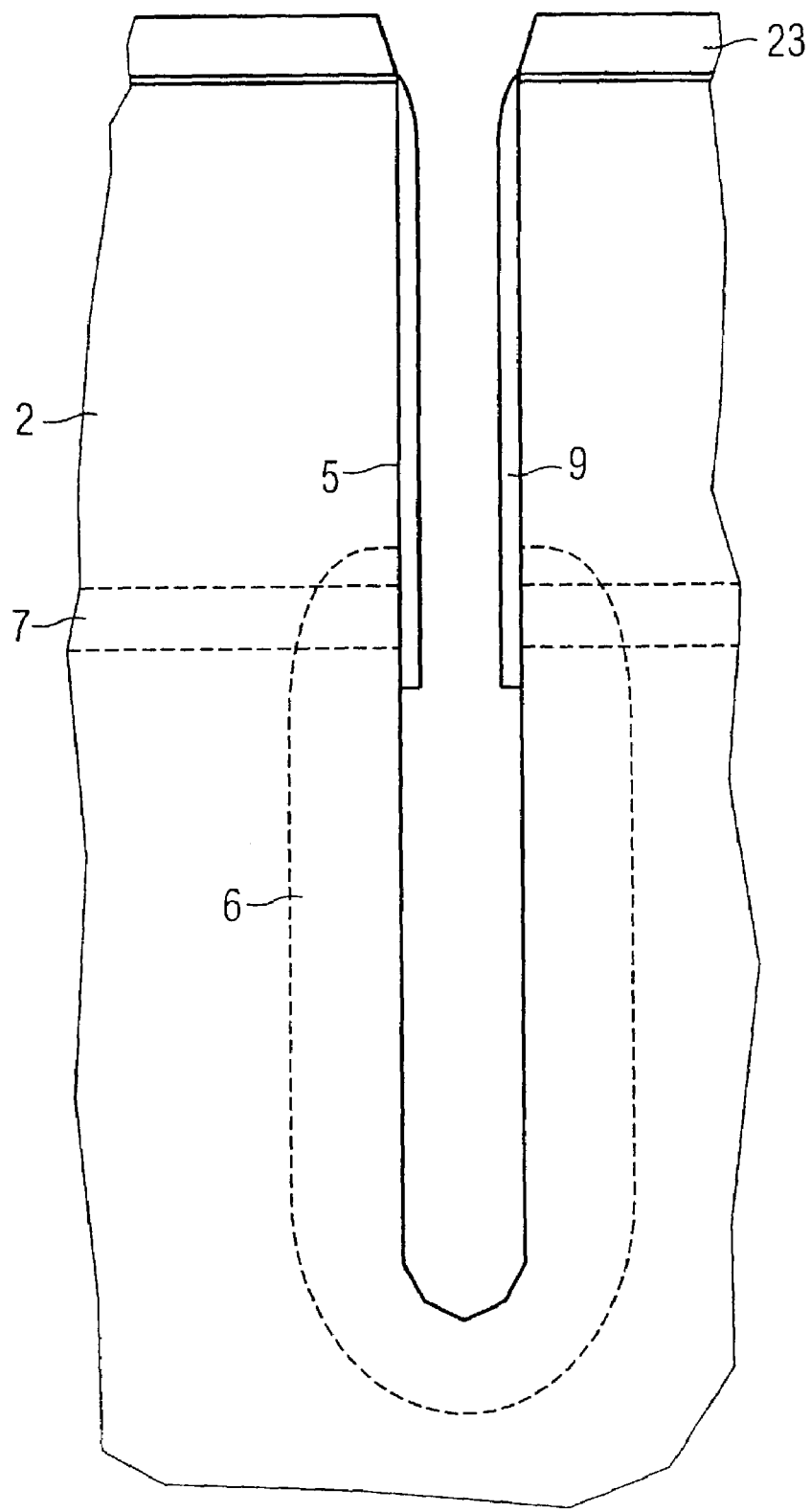

A method for fabricating the memory cell 1 illustrated in FIG. 3 is described with reference to FIGS. 4 to 8. With reference to FIG. 4, a substrate 2 is provided. The substrate is a p-doped silicon substrate, for example. A mask 23 is disposed on the substrate 2. The mask being used to etch the trench 5. The insulation collar 9 is subsequently formed in the upper region of the trench 5 by the customary methods. By introducing dopant into the trench 5, the buried plate 6 is formed in the lower region of the trench 5. Because the substrate 2 is weakly p-doped, a high n-type doping is chosen as doping for the buried plate 6. The buried well 7 may be introduced into the substrate 2 by an implantation, for example, likewise being formed in an n-doped fashion and have an electrical connection to the buried plate 6.

Figure 5:
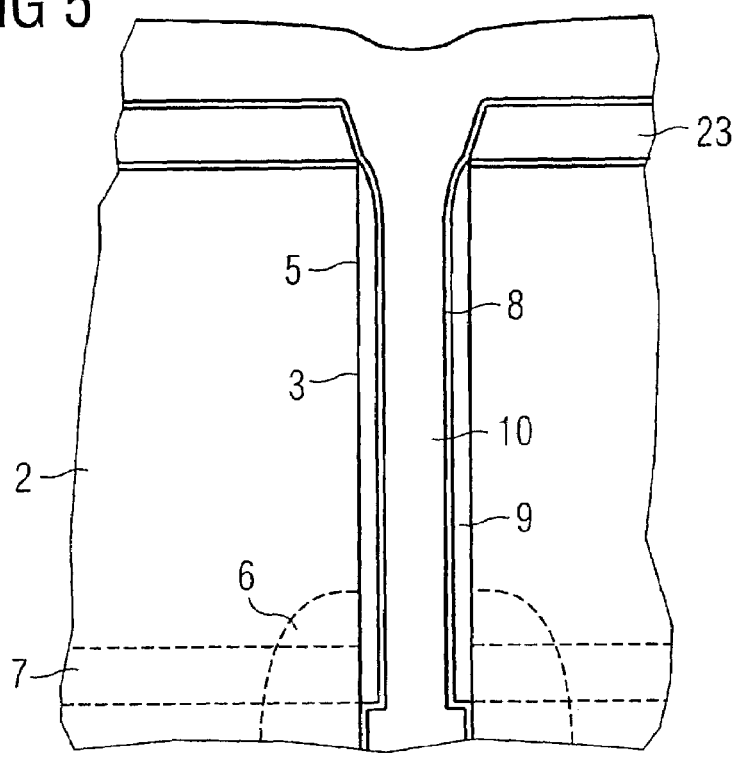

With reference to FIG. 5, the dielectric layer 8 is introduced into the trench 5. By way of example, CVD (chemical vapor deposition) methods and thermal oxidation methods are used for this purpose. By way of example, firstly a thermal oxide layer is formed in the trench 5. The thermal oxide layer is subsequently overgrown with a CVD nitride layer. The conductive trench filling 10 is then formed in the trench 5. The conductive trench filling 10 is formed for example from arsenic- or phosphorus-doped amorphous silicon or polysilicon. To that end, the doped silicon may be deposited for example by a corresponding CVD method. It is likewise possible for a tungsten, tungsten nitride or tungsten silicide layer to be deposited as conductive trench filling 10 by a CVD method. Because both the dielectric layer 8 and the conductive trench filling 10 are implemented by a whole-area deposition process, the dielectric layer 8 and the conductive trench filling 10 are likewise deposited on the mask 23.

Figure 6:
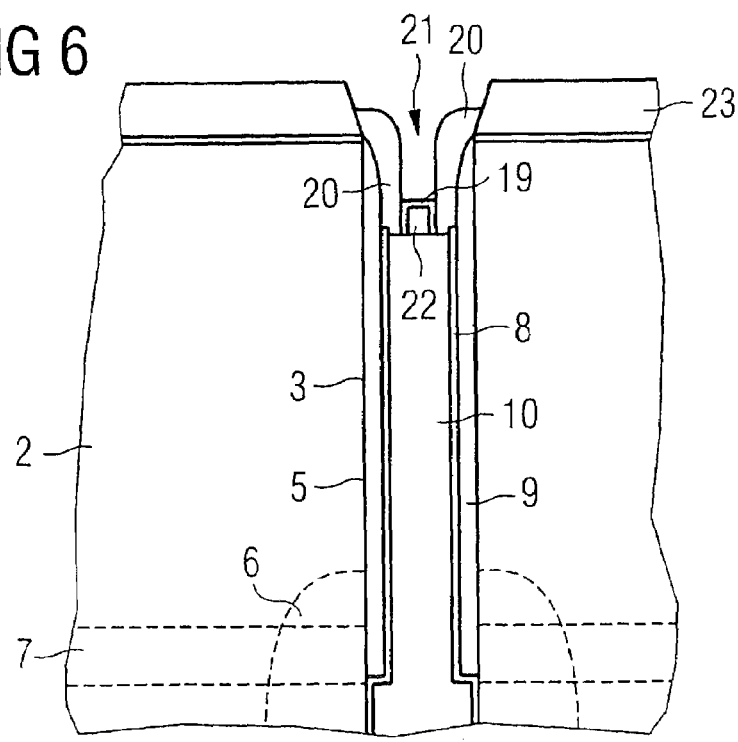
Figure 9:
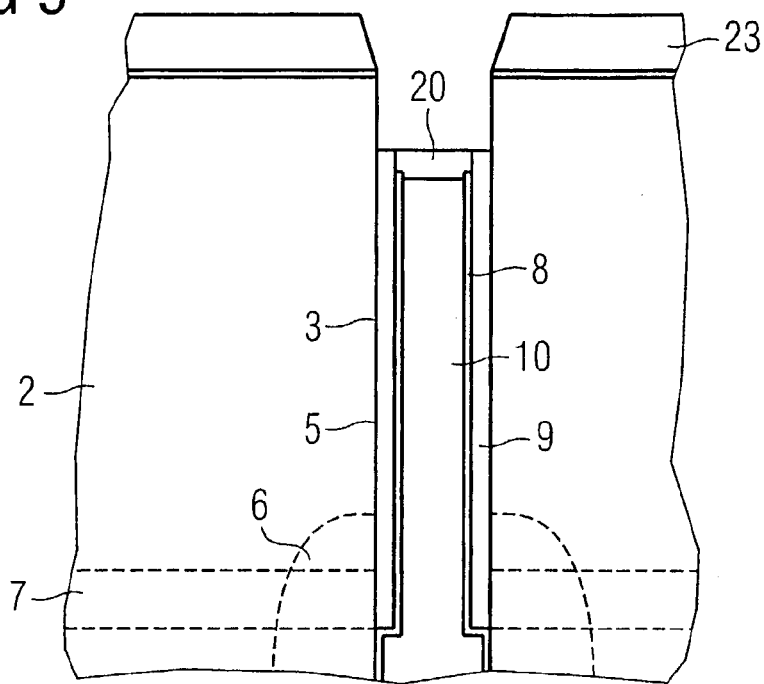
FIGS. 9 to 11 are sectional views showing a fabrication method for forming the memory cell illustrated in FIG. 2.

With reference to FIG. 6, the conductive trench filling 10 and the dielectric layer 8 are removed from the mask 23 and sunk into the trench 5. In this case, first of all the insulation collar 9 remains and only the dielectric layer 8 and the conductive trench filling 10 are sunk into the trench 5. Afterward, the insulating covering layer 20 is formed in the trench 5 using spacer technology. In this case, the insulating covering layer 20 has an inner hole 21. The conductive contact 22 is deposited into the inner hole 21. In this case, the conductive contact 22 is formed for example from doped polysilicon or amorphous silicon or else a metal such as tungsten or tungsten nitride. In this case, the conductive contact 22 is produced in the inner hole 21 of the insulating covering layer 20. Optionally, by way of example, an insulation layer or a diffusion barrier 19 may be formed on the conductive contact 22.

With reference to FIG. 7, the insulation collar 9 and the insulating covering layer 20 are etched back. This can be carried out for example by a timed boron/hydrofluoric acid wet etching or a reactive ion etching using $CF_4$.

With reference to FIG. 8 a selective silicon epitaxial layer is formed on the uncovered substrate 2 in the trench 5 above the insulation collar 9. To that end, by way of example, a dry hydrofluoric acid precleaning is carried out. Afterward, at 900° C. with the addition of hydrogen with a pressure of 20 torr, the interface area with respect to the substrate 2 can be cleaned of a natural oxide. A selective epitaxy is initiated at 800–1000° C. with the addition of silane and hydrogen for an undoped silicon layer, or with the addition of sylane, hydrogen and arsine, or phosphine for an in-situ doping of the grown epitaxial layer. It is also suitable firstly to grow an undoped epitaxial layer, to carry out a reflow process and then to grow an epitaxial layer doped in situ with arsenic or phosphorus. The process elements including undoped epitaxy, doped epitaxy and reflow process can also be performed a number of times one after the other in corresponding sequences. By using a plurality of reflow processes which are carried out during the selective epitaxy and which are carried out with the addition of hydrogen at 900–1100° C., the surface of the grown epitaxial layer is planarized and possible growth defects in the epitaxial layer are eliminated. In comparison with the conventional epitaxy which can likewise be carried out, this novel process has the advantage that the defect density or the growth defects in the epitaxial layer can be reduced by using an in-situ hydrogen reflow process at a temperature which is higher than the growth temperature. The reflow process specified can be carried out repeatedly during an epitaxy in order to further reduce the growth defects and in order to adapt the epitaxial layer to arbitrarily complicated topographies in a manner free from defects by using a repeated sequence of epitaxy and reflow and epitaxy and reflow. Afterward, the epitaxial layer 24 is sunk by using the mask 23 in order e.g. to terminate with the surface of the substrate 2. This sinking can already be effected during the reflow process if the thickness of the epitaxial p-type wafer is chosen in accordance with the volume to be filled.

The selection transistor 4 is formed in and on the substrate 2 by conventional methods.

A method variant for fabricating the memory cell illustrated in FIG. 2 is described with reference to FIGS. 4–5 and 9–11. The fabrication steps that relate to FIGS. 4 and 5 are carried out in the manner already described above. Proceeding from FIG. 5, with reference to FIG. 9, the trench 5 is filled with the insulating covering layer 20. This is usually carried out by using a whole-area CVD process, the insulating covering layer 20 subsequently is removed from the mask 23 by planarization and is sunk into the trench 5 by using a sinking process, such as reactive ion etching (RIE). In this case, the insulation collar 9 and the dielectric layer 8 are likewise removed from an upper region of the trench 5.

Figure 12:
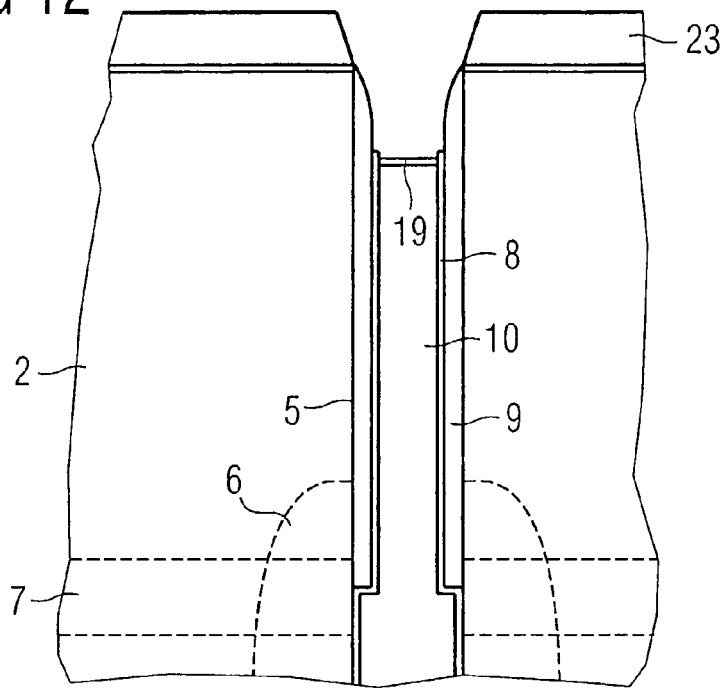
FIGS. 12 and 13 are sectional views showing a method of making the memory cell illustrated in FIG. 5.

A further method variant proceeding from FIG. 5 is illustrated with reference to FIG. 12. Firstly, the conductive trench filling 10 is sunk into the trench 5. In this case, first of all the insulation collar 9 remains and only the dielectric layer 8 and the conductive trench filling 10 are sunk into the trench 5. Afterward, a thermal nitridation is carried out at temperatures of between 600° C. and 1000° C. in an ammonia-containing atmosphere. The diffusion barrier 19 is formed with a thickness of between 0.5 nm and 2 nm on the conductive trench filling 10.

Figure 13:
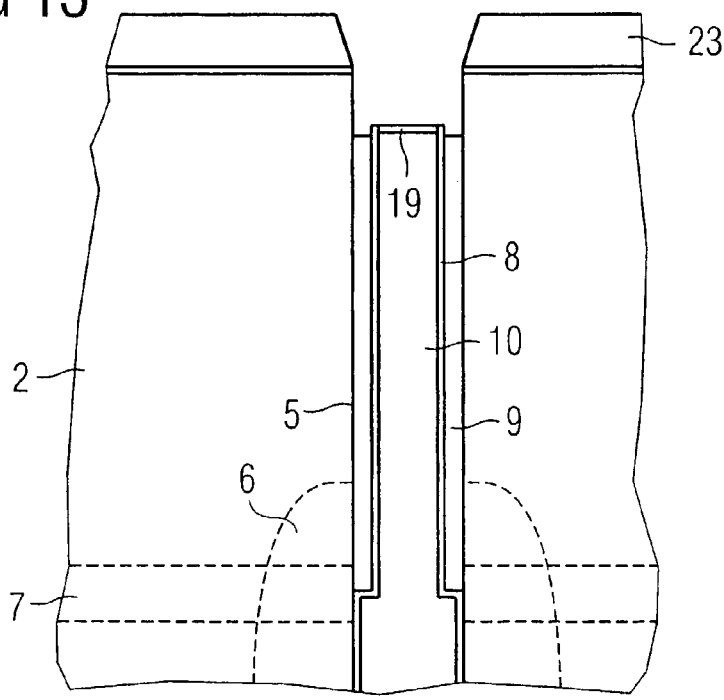

With reference to FIG. 13, the insulation collar 9 is etched back. This can be carried out for example by using a timed boron/hydrofluoric acid wet etching or by using an isotropic dry etching by using reactive ion etching using $CF_4$.

Figure 10:
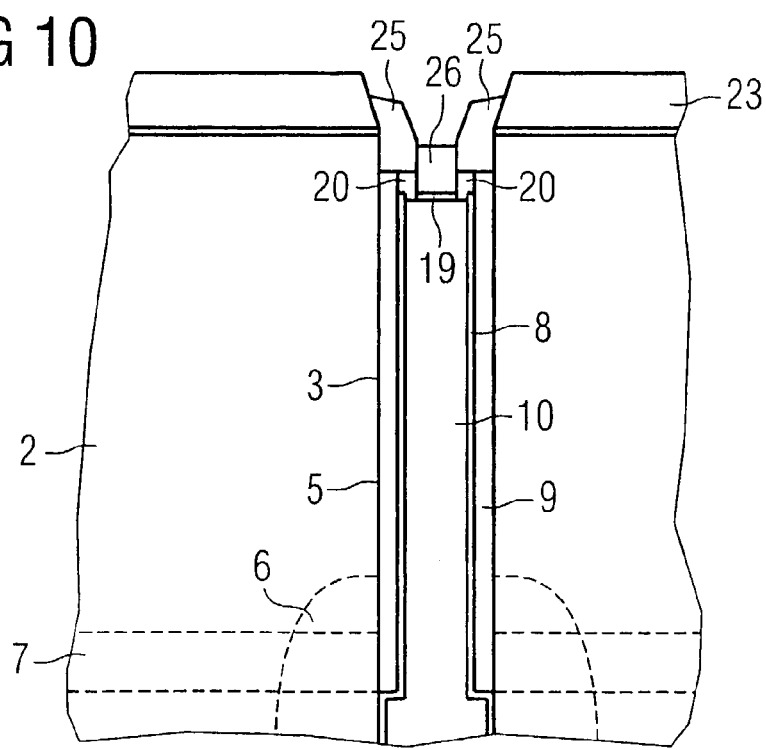

With reference to FIG. 10, a spacer mask 25 is fabricated by using spacer technology. The spacer mask 25 is fabricated for example by using an oxide CVD method and corresponding etching-back steps. In a subsequent RIE (reactive ion etch) etching step, the spacer mask 25 is used to form an inner hole 21 in the insulating covering layer 20. In this case, the inner hole 21 reaches down to the conductive trench filling 10 and uncovers the latter. Afterward, a diffusion barrier 19 made of silicon oxide, silicon nitride, or silicon oxynitride, with a thickness typically of less than 1.5 nm is formed on the conductive trench filling 10 in the inner hole 21. Conductive layers are formed for example from nitrides or silicides such as tungsten nitride, titanium nitride, tantalum nitride, titanium silicide, cobalt silicide, tungsten silicide, or suitable further metals or alloys. A sacrificial layer 26 is subsequently formed in the inner hole 21.

Figure 11:
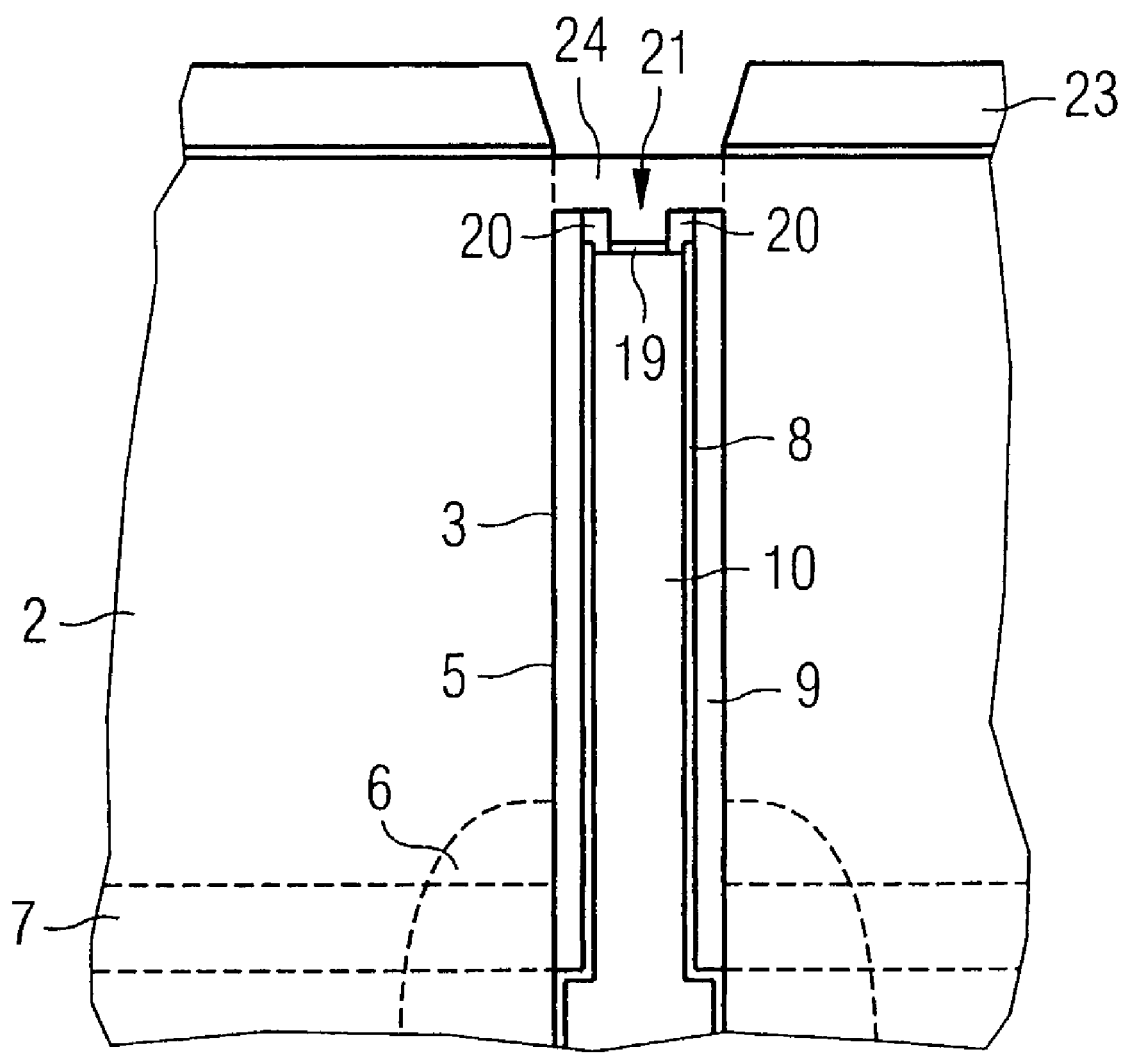

With reference to FIG. 11, first of all the spacer mask 25 is removed by a selective etching process. Afterward, the sacrificial layer 26 is removed likewise in a selective etching step. The substrate 2 is now uncovered in an upper region of the trench 5, so that the insulating covering layer 20 and the diffusion barrier 19 are overgrown with undoped or doped silicon in a subsequent epitaxy step. Since the epitaxially grown silicon grows out of the trench 5 onto the mask 23 during the epitaxial growth process, the grown silicon is planarized to the level of the substrate 2 in a planarization and a sinking step. This is achieved for example by using an RIE sinking process or by using a reflow process. In this exemplary embodiment, too, the epitaxial growth of the epitaxial layer 24 can be improved by one or a plurality of reflow processes carried out in the meantime, thereby reducing growth defects in the epitaxial layer.

We claim:

1. A semiconductor memory, comprising:
    a substrate having a trench formed therein;
    a trench capacitor disposed in said trench;
    a planar selection transistor disposed above said trench capacitor and having a drain doping region;
    a capacitor dielectric disposed in said trench;
    a conductive trench filling disposed in said trench and having a doping as an inner capacitor electrode;
    an insulating covering layer having an inner hole formed therein and being disposed on said conductive trench filling;
    a diffusion barrier preventing said doping of said conductive trench filling from diffusing into said drain doping region
    and disposed on said conductive trench filling; and
    an epitaxial layer grown epitaxially over said diffusion barrier and holding said drain doping region of said planar selection transistor.

2. The semiconductor memory according to claim 1, wherein said drain doping region of said planar selection transistor is contact-connected from underneath to said diffusion barrier.

3. The semiconductor memory according to claim 1, wherein said diffusion barrier is configured horizontally.

4. The semiconductor memory according to claim 1, further comprising a conductive contact disposed in said inner hole.

5. The semiconductor memory according to claim 4, wherein said conductive contact connects said conductive trench filling to said drain doping region of said planar selection transistor.

6. The semiconductor memory according to claim 4, wherein said diffusion barrier is disposed on said conductive contact.

7. The semiconductor memory according to claim 1, wherein:
    said inner hole in said insulating layer has a cross-sectional area;
    said trench has a cross-sectional area; and
    said cross-sectional area of said inner hole is smaller than said cross-sectional area of said trench.

8. The semiconductor memory according to claim 1, wherein said insulating covering layer is formed as a lateral edge web.

9. The semiconductor memory according to claim 1, wherein:
    said insulating covering layer has an upper edge; and
    said diffusion barrier is disposed completely below said upper edge.

10. The semiconductor memory according to claim 1, wherein:
    said insulating covering layer has an upper edge; and
    said conductive contact is disposed above said upper edge.

11. A method for fabricating a semiconductor memory cell, which comprises the following steps:
    forming a trench in a substrate, the trench having an upper region and a lower region;
    filling the trench with a conductive trench filling as an inner capacitor electrode;
    forming a trench capacitor in the trench;
    forming a planar selection transistor with a drain region above the trench capacitor;
    forming a diffusion barrier on the conductive trench filling;
    epitaxial overgrowing of the diffusion barrier with an epitaxial layer;
    after the epitaxial overgrowth of the diffusion barrier, carrying out a reflow process at a higher temperature than the epitaxial overgrowing step; and
    forming the drain region of the planar selection transistor in the epitaxial layer.

12. The method according to claim 11, which further comprises, in the reflow process, adding hydrogen in order to anneal growth defects resulting from flow effects.

13. The method according to claim 12, which further comprises repeating a process sequence including the epitaxial overgrowing step and the reflow process at least once.

* * * * *

UNITED STATES PATENT AND TRADEMARK OFFICE
CERTIFICATE OF CORRECTION

PATENT NO.       : 7,049,647 B2
APPLICATION NO.  : 10/390871
DATED            : May 23, 2006
INVENTOR(S)      : Wolfram Karcher et al.

It is certified that error appears in the above-identified patent and that said Letters Patent is hereby corrected as shown below:

On Title Page
Item [63] should read as follows:

Continuation of application No. PCT/DE01/03235 filed on Aug. 24, 2001.

Signed and Sealed this

Fifth day of September, 2006

JON W. DUDAS
*Director of the United States Patent and Trademark Office*